(12) United States Patent
Feurle et al.

(10) Patent No.: US 6,768,693 B2
(45) Date of Patent: Jul. 27, 2004

(54) INTEGRATED DYNAMIC MEMORY WITH CONTROL CIRCUIT FOR CONTROLLING A REFRESH MODE OF MEMORY CELLS, AND METHOD FOR DRIVING THE MEMORY

(75) Inventors: Robert Feurle, Neubiberg (DE); Thomas Borst, Neubiberg (DE); Jens Egerer, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/368,333

(22) Filed: Feb. 18, 2003

(65) Prior Publication Data

US 2003/0156483 A1 Aug. 21, 2003

(30) Foreign Application Priority Data

Feb. 15, 2002 (DE) .......................................... 102 06 367

(51) Int. Cl.[7] ............................. G11C 7/00; G06F 12/00
(52) U.S. Cl. ........................ 365/222; 365/233; 711/106
(58) Field of Search ............................... 365/222, 233, 365/211, 210; 711/106

(56) References Cited

U.S. PATENT DOCUMENTS 6,504,780 B2 * 1/2003 Leung ........................ 365/222

FOREIGN PATENT DOCUMENTS

DE 195 02 557 C2 10/1995

OTHER PUBLICATIONS

No author listed "HY5U2A6C(L)F 4Banks × 2M × 16bits Synchronous DRAM", Datenblatt der Firma Hynix (Data Bulletin of the company Hynix), Rev. Aug. 1, 2001, pp. 2–25.

* cited by examiner

Primary Examiner—David Lam
(74) Attorney, Agent, or Firm—Laurence A. Greenberg; Werner H. Stemer; Gregory L. Mayback

(57) ABSTRACT

An integrated dynamic memory contains a control circuit for controlling a refresh mode in which the memory cells undergo refreshing of their contents. A controllable frequency generator serves for setting a refresh frequency. A temperature sensor circuit detects a temperature of the memory and outputs a first reference value, and an externally writable circuit is provided for outputting a second reference value. The temperature sensor circuit and the externally writable circuit are alternatively connectible to the control input of the frequency generator for setting the refresh frequency. If the externally writable circuit has been written, the second reference value, which corresponds to a temperature, is fed to the frequency generator; otherwise, the first reference value is supplied. In this manner, users of the memory that are unable to measure temperature can expediently optimize the power consumption that is necessary for standby mode and reduce it at low temperatures.

8 Claims, 2 Drawing Sheets

INTEGRATED DYNAMIC MEMORY WITH CONTROL CIRCUIT FOR CONTROLLING A REFRESH MODE OF MEMORY CELLS, AND METHOD FOR DRIVING THE MEMORY

BACKGROUND OF THE INVENTION

Field of the Invention

The invention relates to an integrated dynamic memory with cells and a control circuit for controlling a refresh mode of the cells, in which the memory cells undergo a content refreshing process with a refresh frequency.

In general, an integrated dynamic memory in the form of a DRAM contains a cell field that includes word lines and bit lines. The memory cells are disposed at intersections of the bit lines and word lines. The cells can be constructed from a storage capacitor and a selection transistor, whereby the selection transistor connects the respective storage capacitor to one of the bit lines. Control terminals of the respective selection transistors are connected to each of the word lines, respectively, for purposes of cell selection. An active word line switches connected selection transistors to conduct. After the relevant word line has been selected, data signals of the memory cells along the selected word line occur at the corresponding bit lines. A data signal of a selected memory cell is evaluated and amplified in a read amplifier of the memory cell field. In a read access operation, the data signals of selected memory cells are read out for further processing; in a write operation, data signals are written into the selected memory cells.

In integrated dynamic memories in the form of DRAMs, what is known as a refresh mode is required at operating times at which the memory is not being accessed from outside, so that the memory cell contents, which can volatilize owing to leakage currents of the storage capacitor or selection transistor, are refreshed and therefore held long-term. In the refresh mode, the evaluated and amplified data signals of selected memory cells are written back directly into the relevant memory cells. This is generally controlled by a control circuit, which also specifies a refresh frequency with which a respective refreshing of memory cell contents is carried out.

The maximum achievable hold time of the contents of a memory cell (known as retention time) is decisive for determining the length of time required between two refresh cycles. The refresh frequency can be selected lower, the longer the maximum achievable retention time of the contents of a cell is, that is to say, the longer the period between two refresh cycles can be. Above all in a standby mode of an integrated dynamic memory, the power consumption is largely determined by the refresh mode. The power consumption of the memory rises as the refresh frequency increases.

SUMMARY OF THE INVENTION

It is accordingly an object of the invention to provide an integrated dynamic memory with a control circuit for controlling a refresh mode of memory cells, and a method for driving the memory that overcomes the above-mentioned disadvantages of the prior art devices of this general type, in which the power consumption, particularly in a standby mode of the memory, can be optimized.

With the foregoing and other objects in view there is provided, in accordance with the invention, an integrated dynamic memory. The memory contains memory cells, a control circuit for controlling a refresh mode of the memory cells in which the memory cells undergo a refreshing of their contents with a refresh frequency, and a controllable frequency generator for setting the refresh frequency with an aid of a reference value. The controllable frequency generator has a control input from which the refresh frequency can be modified, and an output connected to the control circuit. A temperature sensor circuit is provided for detecting a temperature of the integrated dynamic memory and outputs a first reference value which is received by the controllable frequency generator. An externally writable circuit is provided and outputs a second reference value that is received by the controllable frequency generator. The temperature sensor circuit and the externally writable circuit are alternatively coupled to the control input of the controllable frequency generator for setting the refresh frequency.

Besides having a control circuit for controlling a refresh mode of the memory cells, the inventive integrated dynamic memory includes a controllable frequency generator for setting the refresh frequency with the aid of a reference value. The frequency generator contains a control input by way of which the refresh frequency can be modified. An output of the frequency generator is connected to the control circuit. The inventive memory further contains a temperature sensor circuit for detecting a temperature of the memory and outputting a first reference value, which can be externally written, as well as a circuit for outputting a second reference value. The temperature sensor circuit and the externally writable circuit, namely in the form of a register circuit, are alternatively connectible to the control input of the frequency generator for setting the refresh frequency.

The inventive integrated dynamic memory is able to take into account that the retention time of the contents of the memory cells decreases as the temperature rises, because the leakage currents, which occur in the memory cells, of the storage capacitor and/or the respective selection transistor increase with rising temperatures. This can be taken into account for controlling the refresh mode of the memory cells by setting the refresh frequency in dependence on the temperature with the aid of the temperature sensor circuit or the externally writable circuit. It is possible to utilize the temperature of the memory itself, which is detected by the temperature sensor circuit, as a reference value for adjustment or to utilize an externally determined temperature, which can correspond to a system temperature and can be externally programmed in a register circuit in the form of a reference value. A temperature sensor in a system such as a mobile radiotelephone is usually more accurate than a sensor that is implemented on the memory chip.

In either case, the power consumption of the memory in the standby mode can be optimized and reduced at low temperatures to a fraction of the power demanded at higher temperatures. At lower temperatures, the selected refresh frequency is correspondingly lower. When the temperature of the memory or system rises during operation, the refresh frequency is increased by the frequency generator.

According to the inventive method for driving the memory, if the externally writable circuit is written, the second reference value is fed to the control input of the frequency generator. A reference value, i.e. temperature value, which is supplied by a connected system or user is thus utilized for setting the refresh frequency. Otherwise, the first reference value of the temperature sensor circuit is fed to the control input of the frequency generator. The refresh frequency is then controlled in dependence on the memory temperature.

As an expansion hereof, the externally programmed reference value can be utilized as soon as a reference value has been written into the externally writable circuit in the form of a register circuit. In this case, the second reference value is fed to the control input of the frequency generator as soon as the register circuit has been programmed.

With the invention, users of the memory module which are unable to measure temperature and therefore unable to program the register circuit can still optimize the required power consumption for a standby mode and reduce it at low temperatures.

In an embodiment of the inventive integrated dynamic memory, the frequency generator contains an oscillator for sending a signal with a regular frequency and, connected on load side, a programmable frequency divider for dividing the frequency of the signal of the oscillator. One output of the frequency divider is connected to the output of the frequency generator. The oscillator sends a signal with a temperature-independent and regular frequency. The oscillator frequency is divided by a downstream frequency divider down to the value that is required for the refresh frequency. The frequency divider is programmed therein by the temperature sensor circuit by way of the control input. Combining a temperature-independent oscillator with the programmable frequency divider makes it possible to set the refresh frequency as a function of the memory temperature with high precision.

In a development of the invention, the temperature sensor circuit contains a temperature sensor and, connected on a load side, an analog-digital converter for programming the frequency divider. In an embodiment, the temperature sensor contains a diode, and the temperature is detected by tapping a voltage at the diode.

In accordance with an added feature of the invention, the externally writable circuit is a register circuit. A switching unit is provided and has two inputs and one output. A first of the two inputs is connected to the temperature sensor circuit, and a second of the two inputs is connected to the register circuit. The output of the switching unit is connected to the control input of the controllable frequency generator. A check circuit is connected to and checks contents of the register circuit and further connected to and drives the switching unit in dependence on a check result.

Other features which are considered as characteristic for the invention are set forth in the appended claims.

Although the invention is illustrated and described herein as embodied in an integrated dynamic memory with a control circuit for controlling a refresh mode of memory cells, and a method for driving the memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 2:
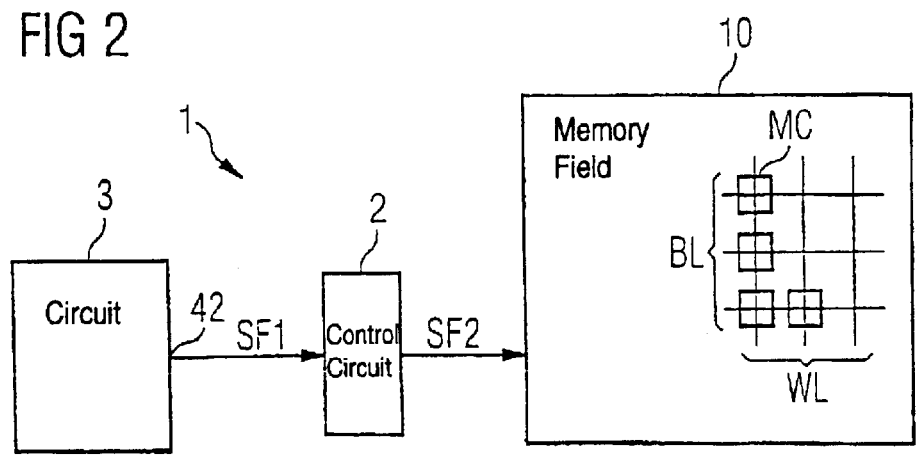
FIG. 2 is a block diagram of an embodiment of the dynamic memory with a control circuit and with a circuit according to FIG. 1 connected to the control circuit.

Referring now to the figures of the drawing in detail and first, particularly, to FIG. 2 thereof, there is shown a memory cell field 10 in which memory cells MC are disposed along word lines WL and bit lines BL. The memory cells MC are disposed at intersections of the bit lines BL and word lines WL. Each of the memory cells MC respectively contains a storage capacitor, which is not represented but which is connected to one of the bit lines BL across a selection transistor, which is likewise not represented. To select one of the memory cells MC, the respective selection transistor is switched to conduct by an activated word line WL, whereupon a data signal of the selected memory cell can be read or written. The data signal of the selected memory cell stands pending at the relevant bit line BL and is evaluated and amplified in a read amplifier of the memory cell field 10, which is also not represented.

During a refresh mode, the data signals that are evaluated and amplified by the respective read amplifier are written back into the relevant memory cells directly. A control circuit 2 is provided for controlling the refresh mode of the memory cells. The control circuit 2 generates a control signal SF2. In particular, in a refresh mode of the memory, the power consumption required as a result of the necessary activating of respective read amplifiers correlates with the refresh frequency. In the interest of achieving an optimally small power consumption, it is desirable for the time period between two refresh cycles to be optimally long, in other words for the refresh frequency to be optimally low. The maximum achievable retention time of the contents of the memory cells is decisive for determining the length of time required between two refresh cycles. This is influenced particularly by leakage currents in the storage capacitor and/or the selection transistor, which increase as the memory temperatures rise.

Figure 1:
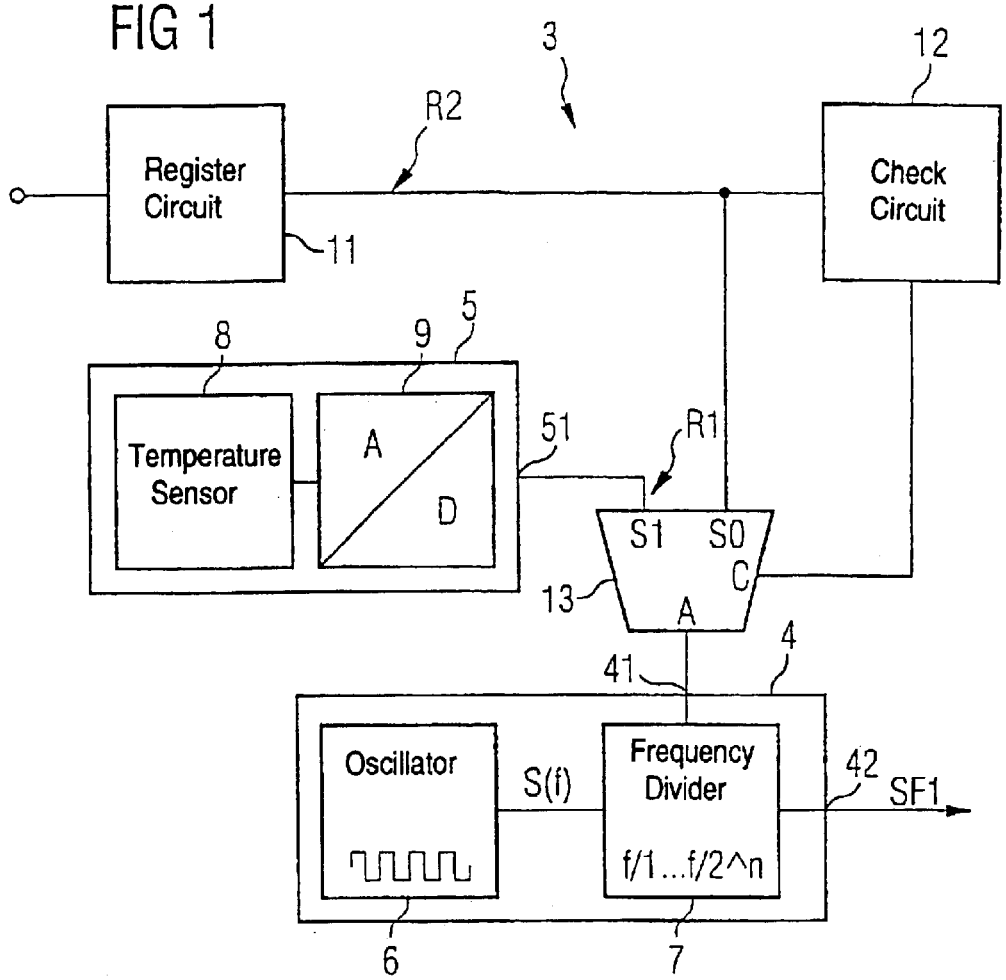
FIG. 1 is a block diagram of an embodiment of a dynamic memory with a frequency generator interconnected with a temperature sensor circuit and a register circuit according to the invention.

A circuit 3 according to FIG. 1 is connected to the control circuit 2. A frequency generator 4 contains a temperature-independent oscillator 6 for sending a signal S(f) with a regular frequency f. Connected in series with the oscillator 6 is a programmable frequency divider 7, by which the frequency f of the signal S(f) can be divided. The output of the frequency divider 7 is connected to an output 42 of the frequency generator 4 and sends a control signal SF1 for forwarding to the control circuit 2 according to FIG. 2. With the aid of the signal SF1, the refresh frequency of the memory is set. The refresh frequency can be changed by way of a control input 41 of the frequency generator 4 by modifying the divider factor of the frequency divider 7 accordingly.

The memory further contains a switching unit 13, for instance in the form of a multiplexer, with two inputs and one output. An input S1 is connected to a temperature sensor circuit 5, specifically its output 51 for outputting a reference value R1 corresponding to a temperature of the memory. The other input S0 is connected to a register circuit 11, and the output A is connected to the control input 41 of the frequency generator 4. The temperature sensor circuit 5 and the register circuit 11 are alternatively connectible to the frequency generator 4 by the switching unit 13.

The register circuit 11 is externally writable and serves for storing and outputting a reference value R2, which corresponds to an externally determined temperature of the system in which the memory is implemented, for instance. Accordingly, a user can write temperature information into the register circuit of the memory, for instance in the form of what is known as an extended mode register, from an external location by a memory controller.

The memory also contains a check circuit 12 which checks the contents of the register circuit 11 and drives the switching unit 13 in dependence on the check result by way of a control input C. If no reference value has been programmed in the register circuit 11, or a default value has been programmed, then the reference value R1 that is measured by the temperature sensor is utilized. This can be implemented in such a way that the reference value R2 that is programmed by the user is utilized once the user has written a value into the register 11.

The temperature of the memory is detected by the temperature sensor circuit 5. The temperature sensor circuit 5 is formed by a temperature sensor 8 and a load-side analog-digital converter 9. The A/D converter 9 supplies the reference value R1 in the form of a multi-bit signal with a resolution of a few bits, with which the divider factor of the frequency divider 7 is programmed. The register circuit 11 also supplies the reference value R2 in the form of a multi-bit signal with a resolution of a few bits, with which the divider factor of the frequency divider 7 can be programmed. In the event that the register circuit 11 has been externally programmed, the second reference value R2 is fed to the control input 41 of the frequency generator 4. Otherwise, the first reference value R1 is fed to the control input 41 of the frequency generator 4.

Figure 4:
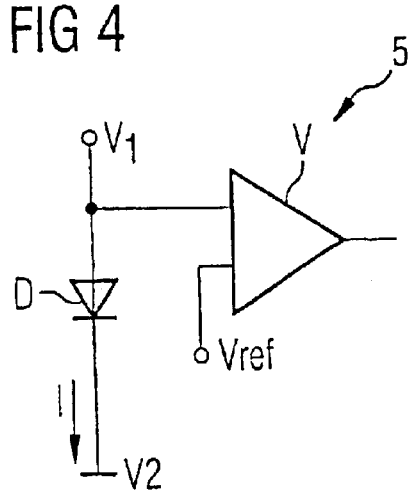
FIG. 4 is a circuit diagram of an embodiment of a temperature sensor circuit.

FIG. 4 represents a simple embodiment of a temperature sensor circuit 5. The temperature sensor 5 contains a diode D that is driven between two supply potentials V1 and V2 with an impressed current I. A dropping voltage at the diode D is tapped and fed to an analog-digital converter with an amplifier V. The dropping voltage at the diode D decreases as the temperature of the diode D rises. This voltage is evaluated with the aid of a reference potential Vref in the amplifier V.

Figure 3:
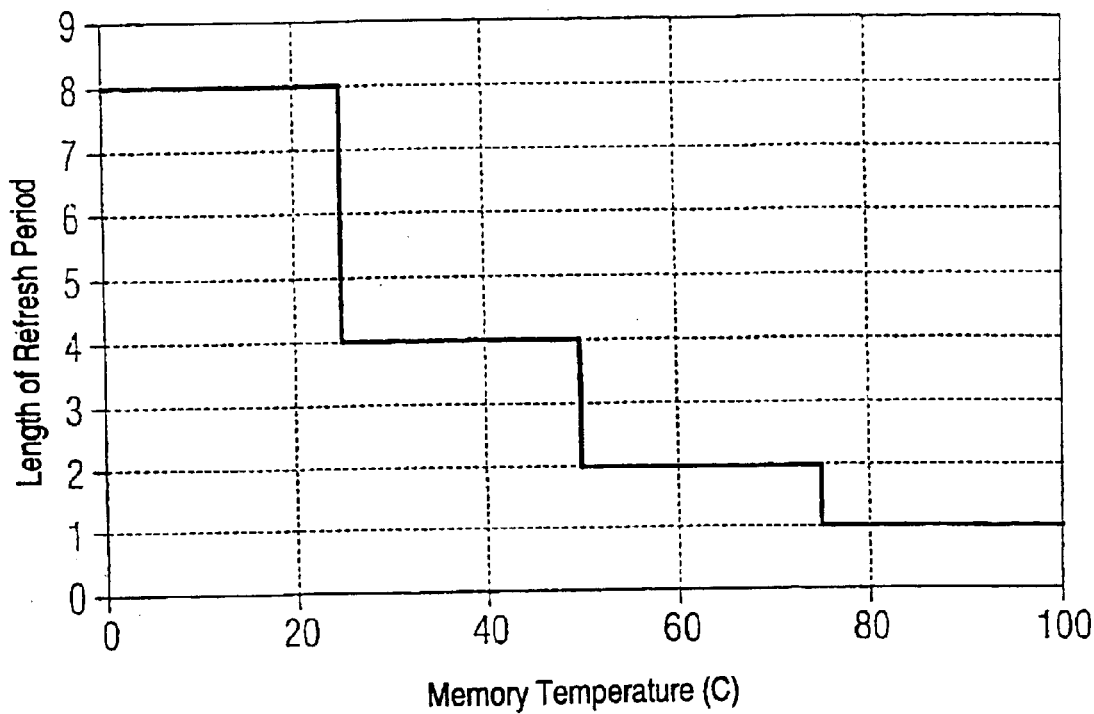
FIG. 3 is a graph showing a refresh period duration as a function of memory temperature.

FIG. 3 represents a diagram of the length of the refresh period as a function of the memory temperature. In the controlling of the refresh mode of the memory, it is taken into account that the retention time of the memory cells decreases exponentially as the memory temperature rises. The diagram represents a normalized refresh period duration. With the temperature sensor according to FIG. 1, the divider factor of the frequency divider 7 is set as a function of the temperature such that the length of the refresh period is halved, and the refresh frequency thereby increased, at discrete temperature values as the memory temperature rises, respectively. It is also possible to utilize several gradations. It would also be possible, given a corresponding frequency divider, to divide the frequency by other values, for instance non-binary values. By controlling the refresh period duration according to FIG. 3, it is possible to optimize the power consumption of a dynamic memory for a standby mode and to reduce it given low temperatures.

We claim:

1. An integrated dynamic memory, comprising:
   memory cells;
   a control circuit for controlling a refresh mode of said memory cells in which said memory cells undergo a refreshing of their contents with a refresh frequency;
   a controllable frequency generator for setting the refresh frequency with an aid of a reference value, said controllable frequency generator having a control input from which the refresh frequency can be modified, and an output connected to said control circuit;
   a temperature sensor circuit for detecting a temperature of the integrated dynamic memory and outputting a first reference value received by said controllable frequency generator; and
   an externally writable circuit for outputting a second reference value received by said controllable frequency generator, said temperature sensor circuit and said externally writable circuit being alternatively coupled to said control input of said controllable frequency generator for setting the refresh frequency.

2. The integrated dynamic memory according to claim 1, wherein said externally writable circuit is a register circuit;
   further comprising a switching unit having two inputs and one output, a first of said two inputs is connected to said temperature sensor circuit, and a second of said two inputs is connected to said register circuit, said output of said switching unit connected to said control input of said controllable frequency generator; and
   further comprising a check circuit connected to and checking contents of said register circuit and further connected to and driving said switching unit in dependence on a check result.

3. The integrated dynamic memory according to claim 1, wherein said controllable frequency generator contains an oscillator for sending a signal with a regular frequency and a load-side frequency divider connected to said oscillator, said load-side frequency divider connected to and programmed by way of said control input for dividing a frequency of the signal received from said oscillator, said load-side frequency divider having an output connected to said output of said controllable frequency generator.

4. The integrated dynamic memory according to claim 3, wherein said temperature sensor circuit contains a temperature sensor and a load-side analog-digital converter connected to said temperature sensor, said load-side analog-digital converter coupled to and programming said load-side frequency divider.

5. A method for driving the integrated dynamic memory according to claim 1, which comprises the steps of:
   feeding the second reference value to the control input of the controllable frequency generator if the externally writable circuit has been written to, otherwise, feeding the first reference value to the control input of the controllable frequency generator.

6. The method according to claim 5, which comprises:
   forming the externally writable circuit as a register circuit; and
   feeding the second reference value to the control input of the controllable frequency generator as soon as a programming of the register circuit has occurred.

7. The method according to claim 5, which comprises:
   forming the externally writable circuit as a register circuit; and
   programming externally the register circuit with a reference value corresponding to a temperature.

8. The method according to claim 5, which comprises forming the first and second reference values to correspond to respective temperatures, and the refresh frequency for the refresh mode is increased by the controllable frequency generator as the temperature rises.

* * * * *